US009535171B2

(12) United States Patent
Herrmann et al.

(10) Patent No.: US 9,535,171 B2
(45) Date of Patent: Jan. 3, 2017

(54) RADIATION DETECTOR WITH STEERING ELECTRODES

(75) Inventors: Christoph Herrmann, Aachen (DE); Klaus Jurgen Engel, Aachen (DE); Roger Steadman Booker, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 12 days.

(21) Appl. No.: 13/821,570

(22) PCT Filed: Sep. 7, 2011

(86) PCT No.: PCT/IB2011/053915
§ 371 (c)(1),
(2), (4) Date: Mar. 8, 2013

(87) PCT Pub. No.: WO2012/035466
PCT Pub. Date: Mar. 22, 2012

(65) Prior Publication Data
US 2013/0168557 A1 Jul. 4, 2013

(30) Foreign Application Priority Data
Sep. 13, 2010 (EP) ..................................... 10176327

(51) Int. Cl.
*G01T 1/20* (2006.01)
*G01T 1/24* (2006.01)
(Continued)

(52) U.S. Cl.
CPC ................. *G01T 1/24* (2013.01); *G01T 1/241* (2013.01); *G01T 1/2928* (2013.01); *H01L 31/022408* (2013.01); *H01L 31/035272* (2013.01)

(58) Field of Classification Search
CPC .................. H01L 31/022408; H01L 31/035272
(Continued)

(56) References Cited

U.S. PATENT DOCUMENTS 6,034,373 A 3/2000 Shahar et al.
6,333,504 B1 * 12/2001 Lingren et al. .......... 250/370.01
(Continued)

FOREIGN PATENT DOCUMENTS

WO 9714060 A1 4/1997
WO 2007100538 A2 9/2007
WO 2010073189 A1 7/2010

OTHER PUBLICATIONS

Limousin, O.; New trends in CdTe and CdZnTe detectors for X- and gamma-ray applications; 2003; Nuclear Instruments and Methods in Physics Research; A 504:24-37.
(Continued)

*Primary Examiner* — David J Makiya
*Assistant Examiner* — Kenneth J Malkowski

(57) ABSTRACT

The invention relates to a radiation detector (100) and an associated method for the detection of (e.g. X or γ-) radiation. The detector (100) comprises a converter element (110) in which incident photons (X) are converted into electrical signals, and an array of anodes (130) for generating an electrical field (E) in the converter element (110). At least two anodes are associated with two steering electrodes (140) to which different potentials can be applied by a control unit (150). Preferably, each single anode or small group of anodes is surrounded by one steering electrode. The potentials of the steering electrodes (140) may be set as a function of the potentials that are induced in these electrodes when an operating voltage is applied between the anodes and a cathode (120). Moreover, a grid electrode (160) may be provided that at least partially encircles anodes (130) and their steering electrodes (140).

12 Claims, 2 Drawing Sheets

(51) Int. Cl.
*H01L 31/0352* (2006.01)
*H01L 31/0224* (2006.01)
*G01T 1/29* (2006.01)

(58) Field of Classification Search
USPC .................................................. 250/352, 369
See application file for complete search history.

(56) References Cited

U.S. PATENT DOCUMENTS

| | | |
|---|---|---|
| 7,145,986 B2 | 12/2006 | Wear et al. |
| 2005/0167606 A1* | 8/2005 | Harrison et al. ......... 250/370.13 |
| 2007/0290142 A1 | 12/2007 | Du et al. |
| 2008/0001092 A1* | 1/2008 | Yokoi et al. ............. 250/370.01 |
| 2009/0189064 A1* | 7/2009 | Miller et al. .................. 250/282 |
| 2011/0012216 A1* | 1/2011 | Morichi et al. ............... 257/429 |

OTHER PUBLICATIONS

Roessl, E., et al.; K-edge imaging in x-ray computed tomography using multi-bin photon counting detectors; 2007; Phys. Med. Biol.; 52:4679-4696.

\* cited by examiner

RADIATION DETECTOR WITH STEERING ELECTRODES

FIELD OF THE INVENTION

The invention relates to a radiation detector and a method for the detection of radiation comprising the conversion of incident radiation into electrical signals that are detected by an array of anodes. Moreover, it relates to an examination apparatus comprising such a radiation detector, particularly to a photon-counting energy resolving CT scanner.

BACKGROUND OF THE INVENTION

The WO 9714060 A1 discloses a radiation detector comprising a semiconductor crystal with a cathode on one and an array of anodes on the other side. To reduce low-energy tailing of the measurement signals, the anodes are designed with a very small area and disposed in the cells of a grid-shaped control electrode to which a negative potential can be applied.

SUMMARY OF THE INVENTION

Based on this background it was an object of the present invention to provide a radiation detector that has a high accuracy, particularly in photon-counting applications like Spectral CT.

This object is achieved by a radiation detector, which includes a) a converter element for converting incident radiation (X) into electrical signals; b) a periodic or quasi-periodic array of anodes disposed on a first side of the converter element; c) at least two steering electrodes that are disposed adjacent to two different anodes; and d) a control unit that is connected to the at least two steering electrodes and adapted to apply different electrical potentials to the at least two steering electrodes, a method for the detection of radiation, which includes: a) converting incident radiation (X) into electrical signals in a converter element; b) applying a first potential to a periodic or quasi-periodic array of anodes on a first side of the converter element; and c) applying at least two different potentials to at least two steering electrodes that are disposed adjacent to two different anodes, and an examination apparatus, particularly a photon-counting energy resolved CT scanner, which includes the radiation detector. Preferred embodiments are disclosed in the dependent claims.

According to its first aspect, the invention relates to a radiation detector for the detection of incident radiation, particularly of high-energy radiation like X-rays or γ-rays. The radiation detector comprises the following components:
a) A converter element for converting incident radiation into electrical signals. The converter element may be made from any suitable direct conversion material that transforms incident radiation to be detected into electrical signals, particularly into a pulse of electrical charges (e.g. electron-hole pairs in the conduction respectively valence band of the material).
b) A periodic or quasi-periodic array of electrodes that is disposed on a first side of the aforementioned converter element. The electrodes will in the following be called "anodes" because during operation they are typically set to a potential that is more positive than some reference potential (throughout this text, the term "potential" shall refer to electrical potentials). It should be noted, however, that the use of this name shall not exclude the possibility to operate said electrodes with any potential that may be required for an application at hand.
c) At least two electrodes which are disposed adjacent to two different anodes of the aforementioned array and which are called "steering electrodes" in the following. The steering electrodes shall electrically be isolated from the adjacent anodes, which can for example be achieved by the disposition of an appropriate isolation material between the anodes and the steering electrodes. Most preferably, the steering electrodes are disposed on the same surface of the converter element as the anodes, with an isolating gap between each steering electrode and its adjacent anode. Moreover, there is preferably one steering electrode (not necessary a different one) disposed adjacent to each anode of the array.
d) A control unit that is connected to the aforementioned steering electrodes for applying different potentials to them. It should be noted that the capability to apply different potentials to the steering electrodes does not exclude that the control unit may, as the case may be, also be able to apply the same potential to the steering electrodes. In a simple case, the control unit may just be able to apply the same pattern of electrical potentials to the steering electrodes (perhaps besides some common offset), such that there is always the same voltage between two particular steering electrodes. In more elaborate embodiments, the control unit may be adapted to apply individual potentials to the steering electrodes that can be set or adjusted within certain ranges.

The invention further relates to a method for the detection of radiation, said method comprising the following steps:
a) Converting incident radiation into electrical signals in a converter element.
b) Applying a first potential to a periodic or quasi-periodic array of anodes disposed on a first side of the converter element.
c) Applying different potentials to at least two steering electrodes that are disposed adjacent to two different anodes.

The method comprises in general form the steps that can be executed with a radiation detector of the kind described above. Reference is therefore made to the above description of the radiation detector for more information on the details of the method.

The radiation detector and the method defined above comprise the application of steering electrodes adjacent to anodes, wherein said steering electrodes may be set to different potentials. It turns out that this approach can considerably improve the accuracy of measurements obtained with an array of anodes, because the assisting potential of the steering electrodes can be fitted to spatial variations of the conditions prevailing at the anodes, which result from imperfections in the crystal.

In the following, various preferred embodiments of the invention will be described that relate to both the radiation detector and the method described above.

In general, any neighboring or adjacent arrangement of a steering electrode and an associated anode is possible. In a preferred embodiment, at least one steering electrode is designed such that it surrounds the associated anode. In this case the charge guiding effect of the steering electrode can be exerted with high symmetry. Preferably all steering electrodes are designed in this way.

In a further development of the aforementioned embodiment, the anode is disposed off-centre with respect to the surrounding steering electrode. In this case more room can be gained for the separate electrical contracting of steering electrode and anode.

The highest operational flexibility may be achieved if each anode of the anode-array is associated to a different adjacent steering electrode. It may however be already sufficient to vary the potentials of the steering electrodes on a spatial coarser scale, allowing to dispose at least one steering electrode adjacent to two or more anodes. These two or more adjacent anodes will then experience the same potential of the steering electrode during operation. Allocating one steering electrode to more than one anode simplifies the design of the radiation detector, particularly with respect to the required individual contacting of the steering electrodes.

According to another embodiment of the invention, a further electrode is provided which will be called "grid electrode" in the following and which at least partially encircles at least one anode with its associated steering electrode. Preferably, the grid electrode encircles each anode of the array with its associated steering electrode (if present). As the electrical signal of each anode is typically recorded individually, each cell of the anode-array will usually correspond to one picture element or "pixel" of an image that can be generated with the whole radiation detector. In this sense, the grid electrode provides a separation between the different pixels (anode cells) of the radiation detector. Applying an appropriate potential to the grid electrode may thus help to reduce undesired crosstalk between neighboring pixels and to improve the accuracy of the detection procedure.

The grid electrode may be operated at the same potential as some other component of the radiation detector, for example as an anode. Most preferably, the grid electrode is however independent, i.e. an individual potential can be applied to it. The potential of the grid electrode may optionally be supplied by the control unit.

In a characteristic embodiment of the radiation detector, a further electrode is disposed on a second side of the converter element opposite to the first side of the anode array. Due to its typical operation with a potential lower than that of the anodes, this electrode will in the following the called "cathode". As explained above, this naming shall comprise no prejudice with respect to the potentials that can actually be applied during the operation of the radiation detector. If the cathode and the anodes are operated at different potentials, an electrical field will be created between them that can move electrical charges generated by incident radiation within the converter element towards the anode(s) and the cathode, respectively.

The potential that is applied to a given steering electrode may (at least approximately) be determined in experiments or from theoretical considerations in view of some optimization criterion. In embodiments of the radiation detector in which a cathode is disposed opposite to the array of anodes, it is observed that potentials are induced in the (electrically floating or unconnected) steering electrodes when a voltage is applied between the cathode and the anodes. The potentials that are actively applied to the steering electrodes may in this case be chosen to be a function of said induced potentials (they may e.g. be a multiple of the induced potentials). This approach is based on the consideration that differences in the induced potentials reflect a spatial inhomogeneity of the configuration and may hence be exploited for the design of appropriate counter-measures, i.e. for the derivation of potentials to be applied to the steering electrodes.

In a preferred realization of the aforementioned embodiment, the potentials that are applied to the steering electrodes may differ by a constant amount from the induced potentials. In this way the steering electrodes may readily be adapted to spatial variations of the electrical conditions in the anode array resulting e.g. from crystal imperfections in the direct conversion material.

The electrical signals that can be recorded at the anodes are typically the signals one is interested in as they provide information about the incident radiation. Preferably, the electrical signals generated in the anodes are counted and/or evaluated with respect to the energy of the incident radiation photons. The latter is possible by for example determining the amplitude/integral of the electrical signals which typically corresponds to the energy deposited by an incident photon.

Moreover, the invention relates to an examination apparatus for the examination of an object (e.g. a patient) with radiation, said apparatus comprising a radiation detector of the kind described above. The examination apparatus may particularly be applied as a baggage inspection apparatus, a material testing apparatus, a material science analysis apparatus, or a medical application apparatus. The examination apparatus may especially be selected from the group consisting of an X-ray apparatus (e.g. a fluoroscopic device), Computed Tomography (CT) imaging system (most preferably a photon-counting Spectral CT imaging system), Coherent Scatter Computed Tomography (CSCT) imaging system, Positron Emission Tomography (PET) imaging system, and Single Photon Emission Computerized Tomography (SPECT) imaging system.

BRIEF DESCRIPTION OF THE DRAWINGS

These and other aspects of the invention will be apparent from and elucidated with reference to the embodiment(s) described hereinafter. These embodiments will be described by way of example with the help of the accompanying drawings in which.

Like reference numbers or numbers differing by integer multiples of 100 refer, in the Figures, to identical or similar components.

DESCRIPTION OF PREFERRED EMBODIMENTS

Figure 1:
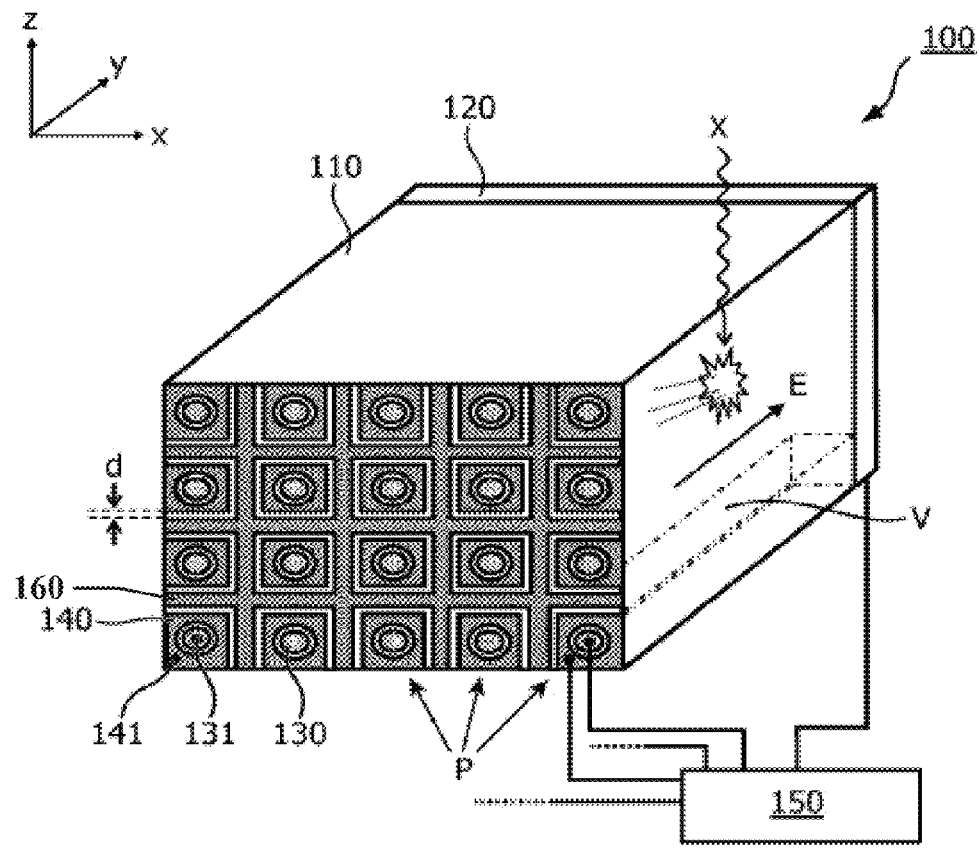
FIG. 1 shows a schematic perspective view of a first radiation detector with a plurality of steering electrodes associated to an array of anodes and with a grid electrode.

Radiation detectors for high-energy radiation like X-rays or γ-rays are for example needed in imaging apparatuses like CT (Computed Tomography) scanners. For these applications, approaches based on photon-counting Spectral CT have been described in literature that offer a large potential of new possibilities (Roessl, Proska: "K-edge imaging in X-ray computed tomography using multi-bin photon counting detectors", Phys. Med. Biol. 52 (2007) 4679-4696). The performance of such a photon-counting based energy-resolving Spectral CT system gets better, the smaller the low-energy tail in the response of the detector to each of the photon energies in the medically relevant energy range between 20 and 140 keV is.

Possible approaches to reduce the low-energy tail are the usage of small pixels (relying on the small-pixel effect) and applying a negatively charged steering electrode close to the anodes. On the one hand, the more negatively charged steering electrode directs electrons towards the small anode areas, which well reduces charge sharing between neighbored pixels. On the other hand, the steering electrode takes over a large part of the unwished induced hole charges, such that also the photo peak is sharpened. The concept of a steering electrode has shown astonishingly good spectral performance in manufactured direct conversion sensor samples even for 1 mm thin material with 1 mm pixel pitch, which would, with the simple pixellated anode design without steering electrode, give very poor spectral performance due to the bad weighting potential. For an extended Alvarez-Macovsky decomposition approach (cf. Roessl, Proska, above) it is however very important to reduce the low-energy tail further in order to improve the measurement results of the K-edge component.

It turns out that just applying a cathode voltage, while the anodes are set to a fixed higher potential (usually GND) in a radiation detector already results in a considerable open-circuit steering electrode voltage. Since the steering electrode is a coherent metallization, it enforces that in all pixels the steering electrode voltage has the same value, which is often in contradiction to the actual space charge situation within the material volume, which usually builds up, when applying a cathode voltage. As a consequence, a pixel might be enforced to a potential of "its steering electrode", which is below or above the "native" steering electrode voltage, which this pixel would see if the steering electrode metallization of this pixel were not forced to a potential dictated by that of the neighbor pixels. As was shown in experiments using a coherent steering electrode metallization, applying a steering electrode voltage which is more positive than the open-circuit voltage reduces the spectral performance at least in terms of the possible charge yield, while—with a coherent steering electrode metallization—the photo-peak to low-energy-tail relation is kept independent of the applied steering electrode voltage.

It is therefore proposed to devise a segmented steering electrode—i.e. to provide a plurality of steering electrodes—such that the steering electrode voltage can take different values at different areas on the anode side. Furthermore, to reduce further the effect of charge sharing, an additional grid is proposed, which is to be placed between pixel boundaries, and which is enforced to e.g. GND potential, thus draining electrons, which would otherwise diffuse into the neighbor pixels. Also a strategy to define reasonable steering electrode voltages is described.

FIG. 1 schematically shows a radiation detector 100 that is designed according to the above principles. It should be noted that the picture shows only a small portion with twelve pixels, while the complete detector typically comprises several hundreds or thousands of such pixels. The detector 100 comprises the following components:

A converter element 110, for example a cuboid block of a direct conversion material like Si, Ge, GaAs, HgI, CZT (cadmium zinc telluride), and/or CdTe, in which incident X-rays X are converted into an electrical signal. The signal will usually consist of charges in the conduction band that can move under the influence of an electrical field. Such an electrical field E is generated in the converter element 110 by the application of different potentials to opposite sides (front side and back side in the Figure) of the converter element. The width and height of the converter element (x,z-direction) typically ranges between about 5 mm and about 20 mm, while a typical depth, sometimes also called thickness (y-direction) is about 3 mm.

A regular, periodic array of (in this example twelve) anodes 130 that are arranged on the front side of the converter element 110. Each anode 130 is individually connected at contact points 131 to a control unit 150. During operation of the X-ray detector 100, the control unit 150 applies an appropriate (positive or GND) potential to the associated anodes 130 and detects and records the signals generated by electrical charges reaching the anodes. The control unit 150 may preferably comprise appropriate counters and/or discriminators etc. (not shown) for a pulse-counting and/or energy-resolved evaluation. The approximately cuboid body volume from which electrical signals reach an anode 130 corresponds to the voxel V of this anode. The two-dimensional basis of the voxel V on the anode side is the "pixel" P that corresponds to an image element of an image generated by the radiation detector 100.

A cathode 120 that is disposed on the back side of the converter element 110 and connected to the control unit 150. During operation, the control unit 150 applies a negative potential to this cathode. Thus an electrical field E is generated between the cathode and the anodes.

A plurality of steering electrodes 140 that are arranged on the front side of the converter element 110 such that each steering electrode 140 encircles one associated (adjacent) anode 130. Via contact points 141, each steering electrode 140 is individually connected to the control unit 150, which can apply separate, different potentials to all the steering electrodes 140. The steering electrodes are separated and thus electrically isolated from the anode and from each other by gaps. The width d of these gaps preferably ranges between 30 µm and 100 µm. A typical value of the pixel pitches is about 500 µm.

FIG. 1 shows the most advanced case of a steering electrode segmentation resulting in each pixel P having its own steering electrode metallization. Compared to the case of the coherent steering electrode metallization, this extreme case features the largest total area on the anode side, which is not covered by metal. As long as the gaps d between neighboring steering electrode metallizations are small (e.g. 50 µm), this should not pose a problem in terms of the "shielding effect" of the steering electrode, according to which it is advantageous to maximize the metalized area of the steering electrode. In order to be able to enforce defined voltages $V_{stEl}$ for each segment, a steering electrode contact has to be provided, for each pixel, from the substrate, to which the sensor is bonded, in addition to the individual anode contact.

Besides the weighting potential, charge sharing (by charge diffusion) is also an important effect which contributes to the low-energy tail especially in case of smaller pixels, even if there is a steering electrode. Hence, an additional grid electrode 160 between pixel boundaries allows to drain charges, which would otherwise diffuse into the neighbor pixel(s), thus reducing the effect of charge sharing. The grid electrode 160 may be enforced to e.g. the same potential as the anodes (i.e. usually GND). There is a need for a separate contact for this grid, to keep it on the desired potential.

Figure 2:
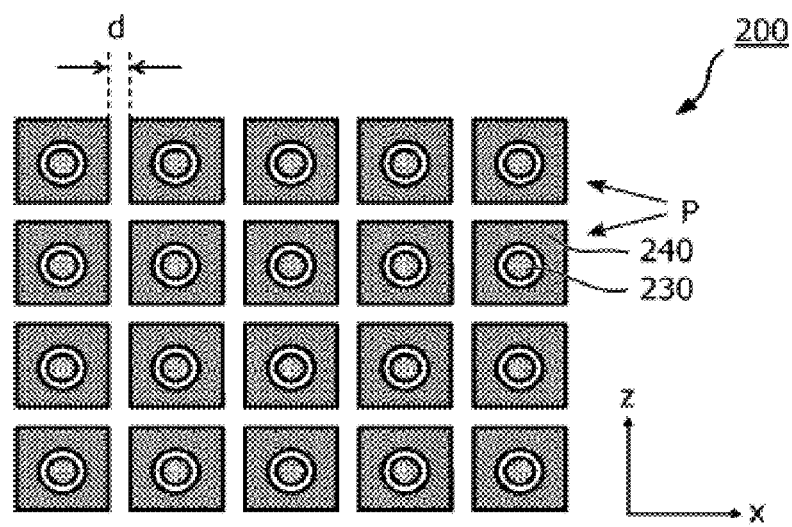
FIG. 2 shows a top view onto the anode array of a second radiation detector with a plurality of steering electrodes, which detector has no grid electrode.

FIG. 2 shows a top view onto the anode array of a radiation detector 200 which differs from the detector 100 in that it has no grid electrode.

Figure 3:
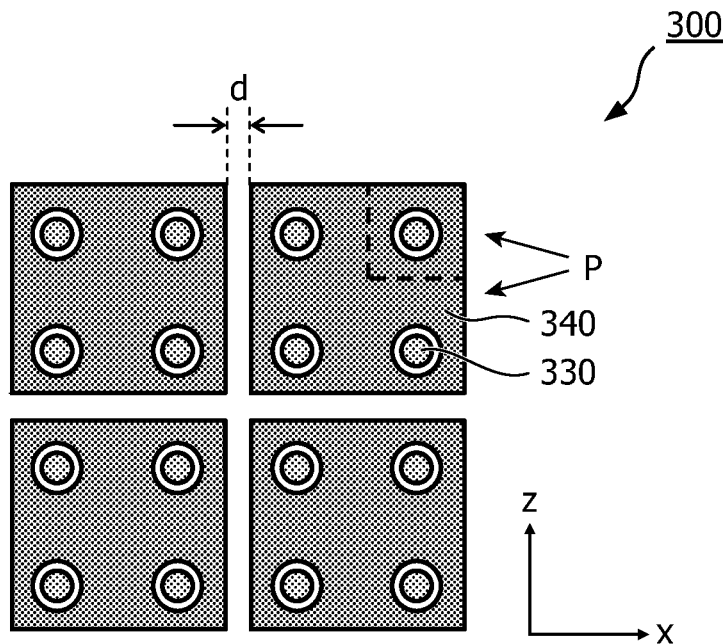
FIG. 3 shows a top view onto the anode array of a third radiation detector, in which each steering electrode is associated to four anodes.

FIG. 3 shows a different embodiment of a radiation detector 300 in which four anodes 330 of each pixel P share a common steering electrode metallization 340. Here, the number of individual steering electrode contacts is reduced to one fourth. Optionally an additional grid electrode (not shown) could be provided as in FIG. 1, said grid electrode encircling each steering electrode 340 with its associated four anodes 330.

Figure 4:
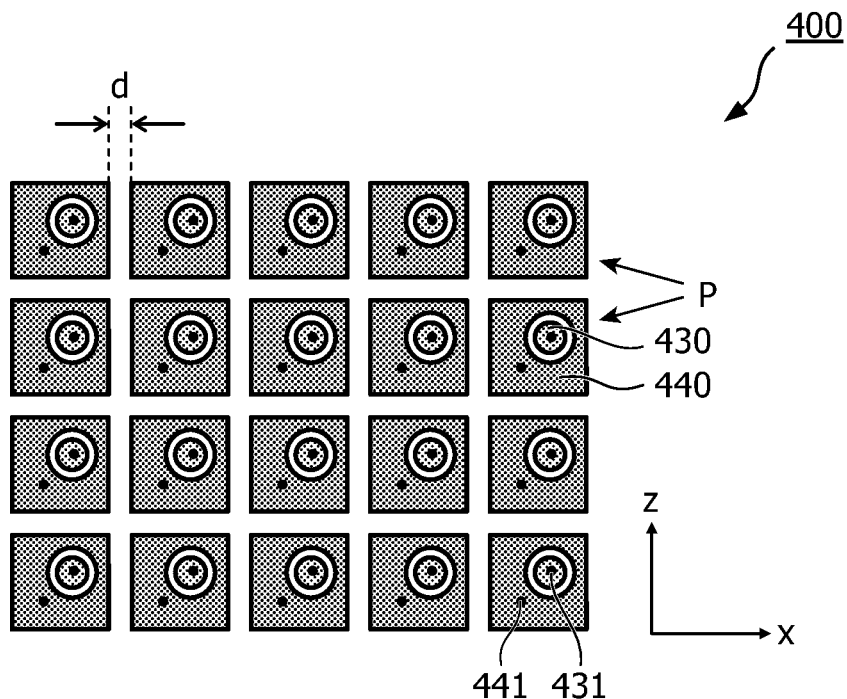
FIG. 4 shows a top view onto the anode array of a fourth radiation detector, in which the anodes are disposed off-centre.

FIG. 4 illustrates a radiation detector 400 which differs from the detector 200 in that the anodes 430 are moved a little off-center of the pixels P. Thus the distance between anode contacts 431 and steering electrode contacts 441 can be increased, facilitating the production of the contacts. Again, this embodiment could alternatively comprise an additional grid electrode (not shown) as in FIG. 1.

A preferred procedure to determine suitable values for the many different steering electrode voltages $V_{StEl}$ is as follows (with reference to FIG. 1):

After applying the cathode voltage to the cathode 120, while the anodes are kept on fixed potential (usually GND), the open-circuit voltages $V_{StEl}(i)$ for each steering electrode 140 settle to a finally constant value, which in the general case are all different for different steering electrodes. By then reducing the externally applied steering electrode voltage $V_{StEl}(i)$ for each steering electrode i by a common fixed value with respect to this open-circuit value, an optimal operating point can be reached.

While the invention has been described in view of an application in photon-counting spectral X-ray detection, the disclosed concepts are not limited to this case. In particular, the invention may be applied in all X-ray detection systems using energy-resolving counting detectors, where a good energy-resolution is intended, especially in medical imaging and medical Computed Tomography.

Finally it is pointed out that in the present application the term "comprising" does not exclude other elements or steps, that "a" or "an" does not exclude a plurality, and that a single processor or other unit may fulfill the functions of several means. The invention resides in each and every novel characteristic feature and each and every combination of characteristic features. Moreover, reference signs in the claims shall not be construed as limiting their scope.

The invention claimed is:

1. A radiation detector, comprising:
   a converter element for converting incident radiation into electrical signals;
   a periodic or quasi-periodic array of anodes disposed on a first side of the converter element;
   a plurality of steering electrodes, each steering electrode encircling a different anode of the array of anodes;
   a control unit that is connected to the plurality of steering electrodes and adapted to apply different electrical potentials to the plurality of steering electrodes wherein said potentials include separately changed potentials which are individually applied as a function of the open-circuit voltages that result between a steering electrode and the associated anode, when a voltage is applied between the associated anodes and a cathode.

2. The radiation detector according to claim 1, wherein the plurality of steering electrodes are separated from each adjacent steering electrode by an electrically isolating gap of thirty to one hundred microns.

3. The radiation detector according to claim 1, wherein a center of each anode is disposed off-center with respect to a center of the surrounding steering electrode.

4. The radiation detector according to claim 2, wherein the gap between steering electrodes is no more than fifty microns.

5. The radiation detector according to claim 1, further including:
   a grid electrode disposed in a grid between each of the plurality of steering electrodes and configured to drain charges.

6. The radiation detector according to claim 1, wherein each steering electrode corresponds one-to-one to each anode of the array of anodes.

7. The radiation detector according to claim 5, wherein an electrical ground potential is applied to the grid electrode.

8. A radiation detector, comprising:
   a converter element for converting incident radiation into electrical signals;
   a periodic or quasi-periodic array of anodes disposed on a first side of the converter element;
   a plurality of steering electrodes, each steering electrode encircling a different anode of the array of anodes;
   a control unit that is connected to the plurality of steering electrodes and adapted to apply different electrical potentials to the plurality of steering electrodes wherein said potentials are a function of the open-circuit voltages that result between a steering electrode and the associated anode, when a voltage is applied between the associated anodes and a cathode;
   a grid electrode disposed in a grid between each of the plurality of steering electrodes and configured to drain charges; and
   wherein the grid electrode includes an electrically isolating gap between the grid electrode and each steering electrode that is no more than fifty microns.

9. The radiation detector according to claim 1, wherein the potentials are applied to the steering electrodes individually.

10. The radiation detector according to claim 1, wherein the potentials applied to the steering electrodes differ by a constant amount from said resulting open-circuit voltages.

11. A method for the detection of radiation, comprising the following steps:
    converting incident radiation into electrical signals in a converter element;
    applying a first potential to a periodic or quasi-periodic array of anodes on a first side of the converter element;
    applying at least two different potentials to at least two steering electrodes of a plurality of steering electrodes and each of the plurality of steering electrodes encircle a different anode of the array of anodes, wherein said potentials include separately changed potentials and are individually applied as a function of the open-circuit voltages that result between a steering electrode and the associated anode, when a voltage is applied between the associated anodes and a cathode.

12. The method according to claim 11, further including:
    draining charges by a grid electrode disposed in a grid between each of the plurality of steering electrodes.

* * * * *